(12) United States Patent
Bates et al.

(10) Patent No.: US 6,760,635 B1
(45) Date of Patent: Jul. 6, 2004

(54) AUTOMATIC SOUND REPRODUCTION SETTING ADJUSTMENT

(75) Inventors: Cary Lee Bates, Rochester, MN (US); Jeffrey Michael Ryan, Byron, MN (US); John Matthew Santosuosso, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/569,784

(22) Filed: May 12, 2000

(51) Int. Cl.[7] .............................................. G06F 17/00
(52) U.S. Cl. ....................... 700/94; 381/103; 455/200.1
(58) Field of Search ................................. 381/103, 107, 381/104; 455/200.1; 84/633, 665, 627, 663; 368/245

(56) References Cited

U.S. PATENT DOCUMENTS

| | | | | |
|---|---|---|---|---|
| 4,686,707 A | | 8/1987 | Iwasaki et al. ............. 455/200 |
| 5,046,107 A | * | 9/1991 | Iwamatsu .................. 381/107 |
| 5,203,028 A | | 4/1993 | Shiraishi .................. 455/154.1 |
| 5,241,696 A | * | 8/1993 | Mori et al. ............... 455/186.2 |
| 5,530,761 A | | 6/1996 | d'Alayer de Costemore d'Arc ..... 381/57 |
| 5,530,924 A | * | 6/1996 | Miller ..................... 455/186.1 |
| 5,661,815 A | * | 8/1997 | Park ........................... 381/108 |
| 6,236,622 B1 | * | 5/2001 | Blackman .................... 368/10 |
| 6,263,502 B1 | * | 7/2001 | Morrison et al. ............ 725/47 |
| 6,341,166 B1 | * | 1/2002 | Basel ........................ 381/103 |

\* cited by examiner

Primary Examiner—F. W. Isen
Assistant Examiner—Brian T. B. Pendleton
(74) Attorney, Agent, or Firm—Moser, Patterson & Sheridan, LLP (57) ABSTRACT

Apparatus, article of manufacture, and method for automatic adjustment of sound reproduction settings on an audio or audio/visual system based on listener preference and/or experience is provided. In one embodiment, an audio system includes an apparatus for adjusting an output parameter of the audio system, the apparatus comprising: a memory for storing a stored output parameter setting associated with an audio program being played on the audio system; and a processor configured to: determine whether a stored output parameter setting is associated with an audio program being processed on the audio system; if the stored output parameter setting is associated with the audio program, compare the stored output parameter setting to a saved output parameter setting; and if the stored output parameter setting is greater than the saved output parameter setting, change the output parameter to the stored output parameter setting.

32 Claims, 6 Drawing Sheets

AUTOMATIC SOUND REPRODUCTION SETTING ADJUSTMENT

BACKGROUND OF THE INVENTION

1. Field of the Invention

The present invention generally relates to an apparatus, method, and article of manufacture for sound reproduction utilizing components having audio systems, such as radios, televisions, cassette players, record players, compact disc players, personal computers and other digital or analog sound systems. More specifically, the invention relates to automatic adjustment of sound reproduction settings on an audio system based on listener preference and/or history.

2. Background of the Related Art

Many audio programs or audio/visual programs provide program identification codes as the programs are broadcast to or played on an audio or audio/visual system. A listener of the program typically has a preferred sound reproduction setting associated with each program being played. For example, a driver in a car listening to a news radio program may have a preferred volume setting for listening to the news radio program. However, the same person may have a different volume preference for listening to a musical program or to a particular favorite song. Currently, the listener of the program manually adjusts the volume setting, the treble setting, the bass setting or any other sound reproduction settings on the audio system to achieve a preferred listening environment. Manual adjustment of sound reproduction setting becomes a tedious task when a listener has to repeatedly adjust the listening parameters as the program changes or as the song changes.

Therefore, there is a need for an apparatus, an article of manufacture, and a method for automatically adjusting sound reproduction settings on an audio or audio/visual system, such as volume level, based on a listener's preference and/or history.

SUMMARY OF THE INVENTION

The present invention provides apparatus, article of manufacture, and method for automatic adjustment of sound reproduction settings on an audio or audio/visual system based on listener preference and/or experience. In one embodiment, an audio system includes an apparatus for adjusting an output parameter of the audio system, the apparatus comprising: a memory for storing a stored output parameter setting associated with an audio program being played on the audio system; and a processor configured to: determine whether a stored output parameter setting is associated with an audio program being processed on the audio system; if the stored output parameter setting is associated with the audio program, compare the stored output parameter setting to a saved output parameter setting; and if the stored output parameter setting is greater than the saved output parameter setting, change the output parameter to the stored output parameter setting.

Another aspect of the invention provides a method for adjusting an output parameter for an audio system, comprising: determining whether a stored output parameter setting is associated with an audio program being processed on the audio system; if the stored output parameter setting is associated with the audio program, comparing the stored output parameter setting to a saved output parameter setting; and if the stored output parameter setting is greater than the saved output parameter setting, changing the output parameter to the stored output parameter setting. Preferably, the method further comprises: detecting an adjustment to the output parameter; and changing the stored output parameter setting based on the adjustment.

In another embodiment, the stored output parameter setting includes a stored volume setting, and the method further comprises periodically performing a volume erosion process. The process comprises: decreasing the stored volume setting by a fixed decrement; comparing the stored volume setting to a threshold volume setting; and if the stored volume setting is less than the threshold volume setting, deleting from memory the stored output parameter setting for the audio program.

Another aspect of the invention provides a computer-readable medium containing instructions which, when executed by one or more processes, performs a method comprising: determining whether a stored output parameter setting is associated with an audio program being processed on the audio system; if the stored output parameter setting is associated with the audio program, comparing the stored output parameter setting to a saved output parameter setting; and if the stored output parameter setting is greater than the saved output parameter setting, changing the output parameter to the stored output parameter setting.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention provides apparatus, article of manufacture, and method for automatic adjustment of sound reproduction settings on an audio or audio/visual system based on listener preference and/or experience. Generally, the invention utilizes a processor or computer system to determine whether a set of sound reproduction settings stored in memory are associated with a particular program or song that is being played on the audio system. The processor changes the sound reproduction settings, if necessary, to stored, sound reproduction settings stored in memory for the particular audio program or song.

Figure 1:
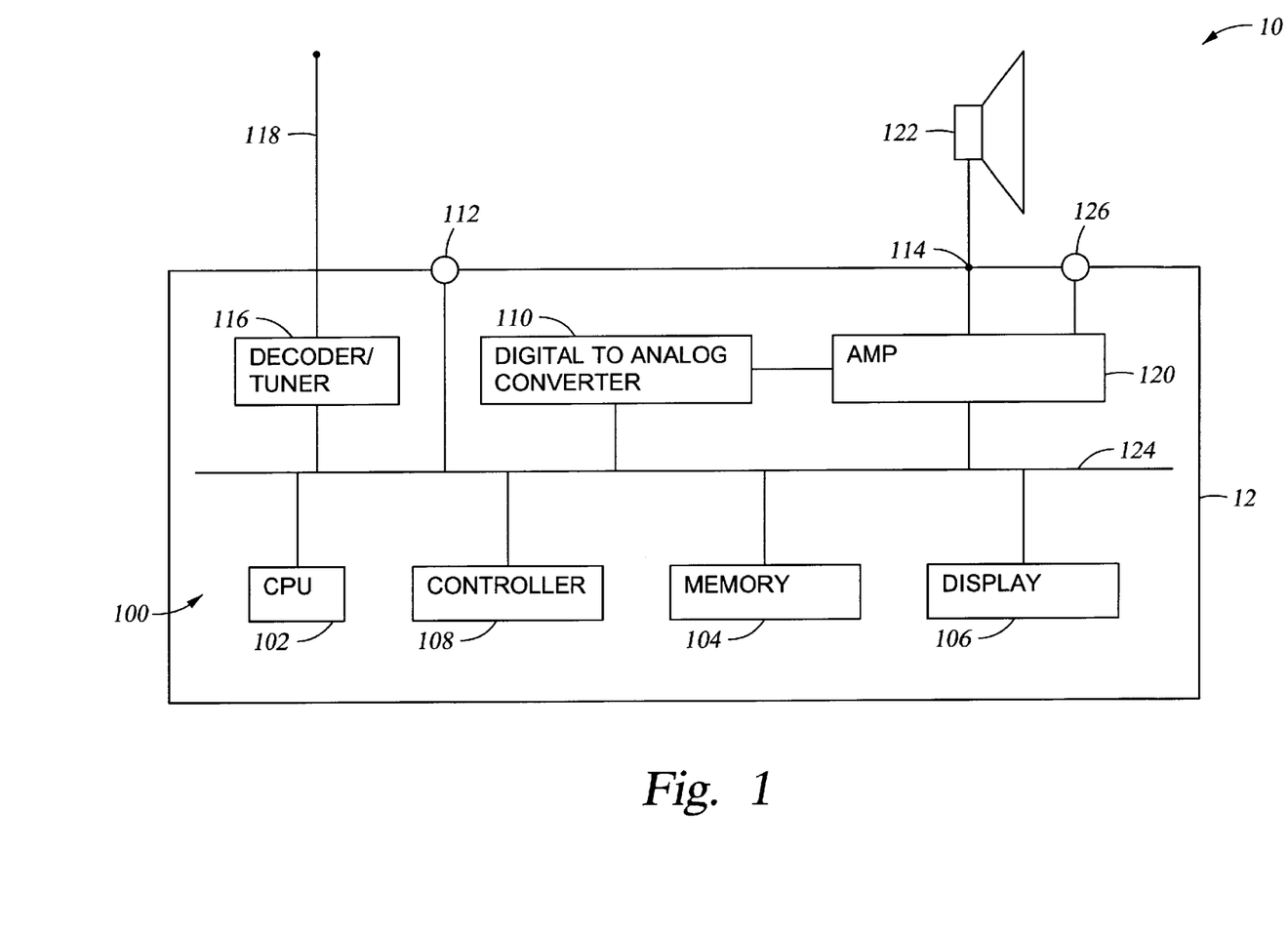
FIG. 1 is a schematic representation of an audio system having an automatic volume adjustment system according to the invention.

FIG. 1 is a schematic representation of an audio system having an automatic volume adjustment system according to the invention. Although the invention is described with respect to automatic adjustment of a volume setting, it is understood that the invention is applicable to automatic adjustment of other sound reproduction settings or output parameters, including bass, treble, etc. The audio system 10 illustrated in FIG. 1 represents a typical car stereo system having a head unit 12, such as a CD receiver, a CD changer controller/receiver, and/or a cassette receiver. The audio system 10 includes an antenna 118 attached to the head unit 12 and a speaker system 122 connected to an amplifier section of the head unit 12. The head unit 12 includes a decoder/tuner 116 connected to the antenna 118 for receiving and decoding broadcast radio signals. The head unit 12 may also include one or more input connectors 112 for receiving audio signals from an external source, such as a CD changer. The head unit 12 includes an amplifier 120 for driving the speaker system 122 to physically reproduce sound. The amplifier 120 may also include a pre-amp output 126 for connecting additional amplifiers and speaker systems to the audio system. Although the invention is described utilizing a car stereo system, it is understood that the invention is applicable to other audio systems or audio/visual systems, such as home stereos, home theaters, televisions, personal computers, etc.

Also, the invention can be implemented as a program product for use with a computer system. The program(s) of the program product defines functions of the preferred embodiment and can be contained on a variety of signal/bearing media, which include, but are not limited to, (i) information permanently stored on non-writable storage media, (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. Such signal-bearing media, when carrying computer-readable instructions that direct the functions of the present invention, represent embodiments of the present invention.

The audio system 10 includes an automatic volume adjustment (AVA) system 100 of the invention, and many components of the AVA system 100 are also utilized by the audio system 10 for processing signals. The AVA system 100 includes a central processing unit (CPU) 102, a memory 104, one or more controls 108, a digital-to-analog converter or DA converter 110 and a display 106. The components of the AVA system 100 are connected by a bus 124 which facilitates exchange of data and command signals between components. Other components of the head unit 12, including the tuner 116 and the amplifier 120, are also connected to the bus 124. Although not shown, the AVA system 100 may include any number of interfaces to facilitate communication between the components of the AVA system 100.

As shown in FIG. 1, the tuner 116 serves as an input source to the audio system 10. Preferably, the radio tuner 116 is a tuner for digital radio signals, and includes a decoder for receiving the digital radio signals. The radio tuner 116 is connected to an antennae 118, adapted for reception of the digital radio signals by the radio tuner 116. Although the invention is described with respect to a digital radio system, the inventors contemplate application of the invention for a variety of digital and/or analog sources including digital television, internet radio, compact discs, etc. The signals received by the tuner 116 are converted from a digital format to an analog format by the DA converter 110. The analog signals are amplified by an amplifier 120 which drives the speaker system 122 to physically reproduce the sound. The overall signal processing is controlled by the CPU 102.

The CPU 102 processes the digital signals received by the tuner 116, and retrieves a program or song identification from the data received. Typically, the song or program information is provided or broadcast along with the digital radio signal. The song or program information typically includes artist, title, length of program, CD title and label information. Preferably, the program identification or song identification information is displayed on a display 106, which allows a user or listener to see this information. A number of controls 108, including volume, bass, treble, channel selection, etc., allows a listener to control selection of the program source and the sound reproduction settings. The CPU 102 also determines whether the audio program or song being processed by the system has a sound reproduction setting stored in memory 104. The memory 104 stores entries of song or program information and a sound reproduction setting, such as a volume level, associated with particular song or program. Memory 104 is preferably a random access memory (RAM) sufficiently large to hold the necessary programming and data structures of the invention. While memory 104 is shown as a single entity, it should be understood that memory 104 may comprise a plurality of modules, and that the memory 104 may exist at multiple levels, from high speed registers and caches to lower speed but larger DRAM chips. Memory 104 may also include a storage medium, such as a Direct Access Storage Device (DASD), a floppy disk drive, an optical storage device and the like.

Figure 2:
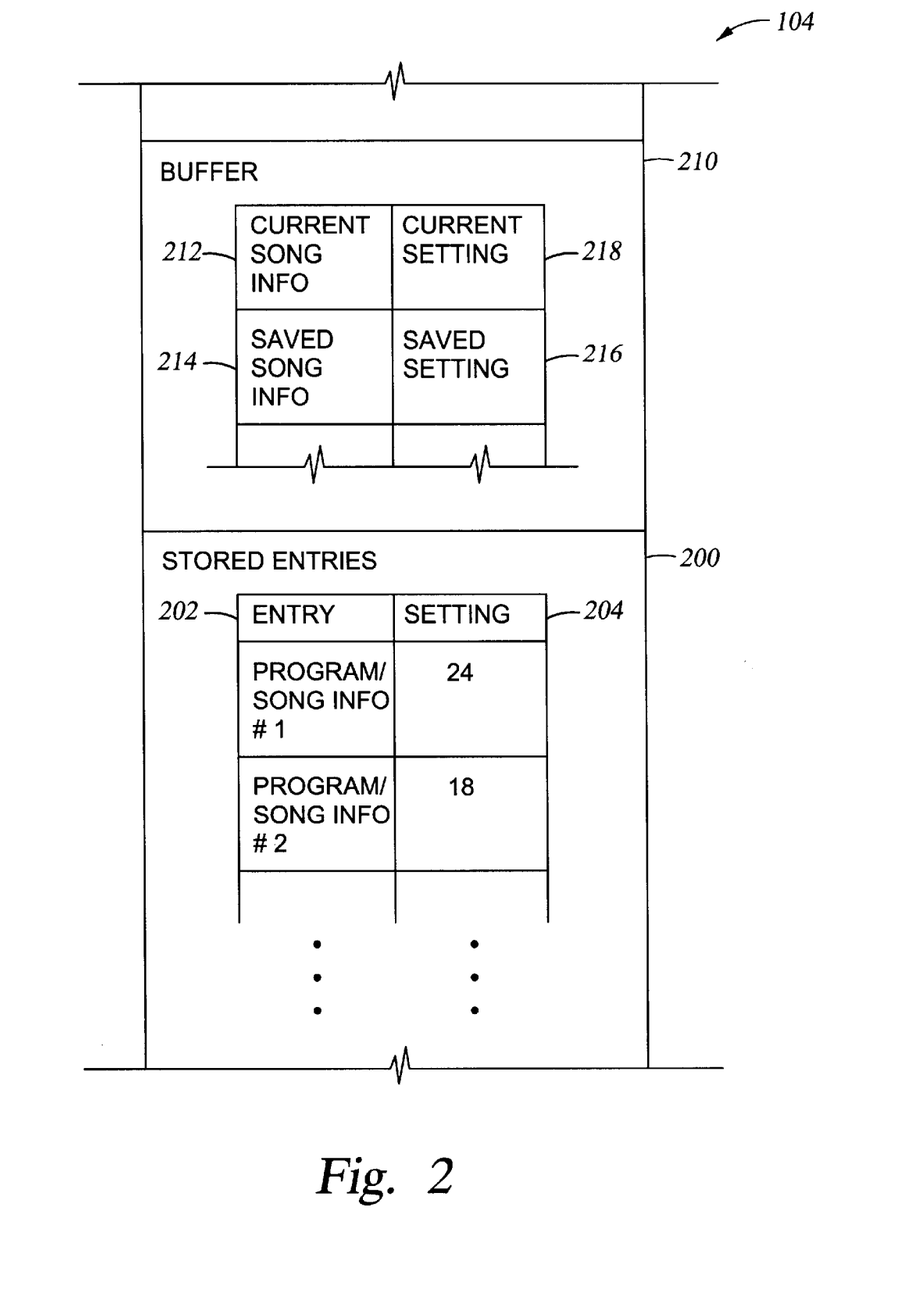
FIG. 2 is a data structure illustrating records of song information entry and associated sound reproduction settings in a memory 104.

FIG. 2 is a data structure illustrating records of song information entry and associated sound reproduction settings in a memory 104. The data structure of stored entries 200 in memory 104 includes song/program entries 202 and the associated sound reproduction setting 204. Each entry 202 includes song/program information, and each sound reproduction setting 204 includes information such as the volume level. The memory 104 also includes a buffer section 210 for storing current song information 212, current sound reproduction setting 218, saved song information 214, saved sound reproduction setting 216 and other temporary data storage as needed.

The AVA system 100 of the invention performs a process for automatically adjusting volume of an audio system, such as the processes described below with respect to FIGS. 3A–C. Preferably, a user option is provided to activate or deactivate the AVA system 100. Additionally, the AVA system 100 may include a default setting for activating (or deactivating) as the audio system 10 is activated.

Figure 3A:
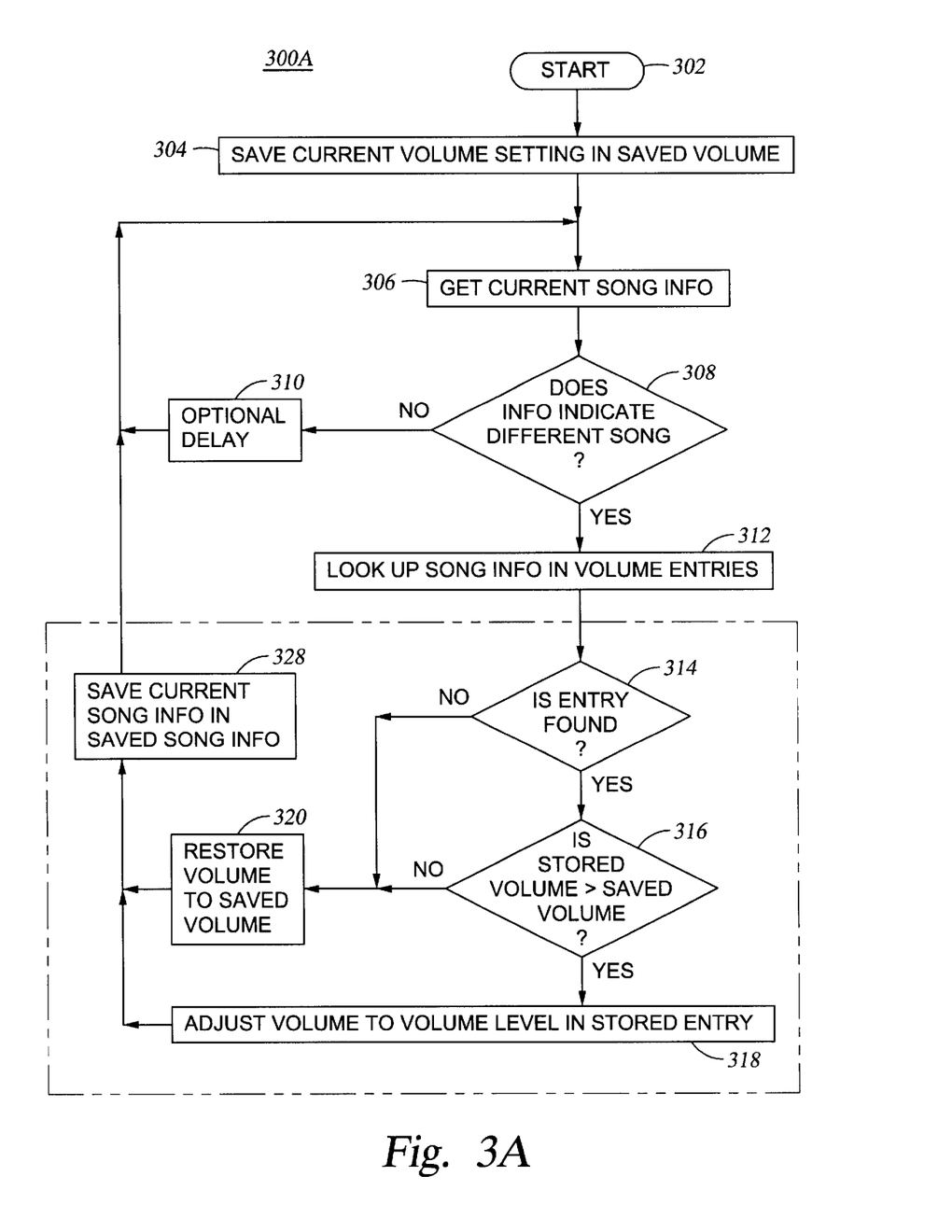
FIG. 3a is a flow diagram illustrating one embodiment of a process 300 for automatically adjusting volume of an audio system using the AVA system 100.

FIG. 3a illustrates one embodiment of a process 300a for automatically adjusting volume of an audio system using the AVA system 100. The AVA system 100 allows a listener to set an initial volume setting and increases the volume level when a stored volume setting for a currently playing song is greater than the initial volume setting. When a song having no stored entry or when a stored volume setting is less than the initial volume setting, the AVA system plays the song at the initial volume setting. The process 300a starts at step 302, typically by turning on the audio system 10. The process 300a runs as a background process when the audio system is activated to receive and play back audio signals. At step 304, the initial volume setting at the start of the process 300a is saved or stored in memory 104 as the saved volume setting 216. The saved volume setting 216 represents the volume level at which a listener prefers for a particular listening session and serves as the volume level against which stored settings for songs in stored entries are compared to determine whether an adjustment needs to be made. The saved volume setting 216 is also utilized by the volume change detection process 400 described below with respect to FIG. 4. Next, at step 306, the current song information is identified by the CPU. At step 308, the CPU determines whether the current song being processed by the system is different from the previous song or program as indicated by contents in saved song info 214. At initial activation of AVA system 100, the saved song info 214 may contain information for the last song from a previous listening session or no information at all. If the current song information does not indicate a different song being played, the process 300a returns to step 306 to retrieve the current song information again. Alternatively, an optional delay step 310 for a preset period of time can be performed before returning to step 306. The loop comprising steps 306 and 308 (and optionally 310) is repeated until the current song information indicates a different song at step 308.

When a different song is detected, the process 300a proceeds to step 312 where the CPU 102 looks up or searches the memory 104 for an entry with sound reproduction settings associated with the current song. If an entry for sound reproduction settings associated with the current song being played is found stored in memory 104 (step 314), then the process proceeds to step 316 to determine whether an adjustment-to the sound reproduction setting is needed. If no entry for a sound reproduction setting is found in memory in step 314, then the CPU 102 restores the saved volume setting 216 as the playing volume level in step 320, so that in this case the current volume level remains unchanged The process 300 then proceeds to step 328 to store the current song information as the saved song info 214, which facilitates detection of the next new/different song. The process 300 then returns to step 306 and performs the loop comprising steps 306, 308 and 310 until a different song is processed by the audio system. Alternatively, if no entry for a sound reproduction setting is found in memory in step 314, a listener may be provided an option to store an entry for the current song as described below in FIG. 3b.

Referring back to step 316, if the stored volume setting associated with the current song is greater than the saved volume setting (i.e., current volume setting), then the CPU 102 sends a signal to the amplifier 120 of the system 100 to increase the volume setting to match the volume level of the stored volume setting associated with the current program or song (step 318). The process 300 then proceeds to step 328 to store the current song information as the saved song info 214 and returns to step 306.

At step 316, if the stored memory volume setting of the song currently being played is less than the saved volume setting 216, then the CPU 102 restores the saved volume setting 216 as the playing volume level in step 320, (i.e., changes the current volume level to match the saved volume setting 216). If the current volume level is the same as the saved volume setting 216, step 320 is a no op (i.e., no operation is carried out). The process 300 then proceeds to step 328 to store the current song information as the saved song info 214 and returns to step 306. In this embodiment, when the stored volume is less than the saved volume, the saved volume level is restored to allow a listener to listen at the initial desired volume. Thus, each song is played at a volume level at least as high as the initial volume setting. This situation may occur, for example, when a listener had turned up the volume to a high initial level due to excessive noise, such as when driving with windows down.

Figure 3B:
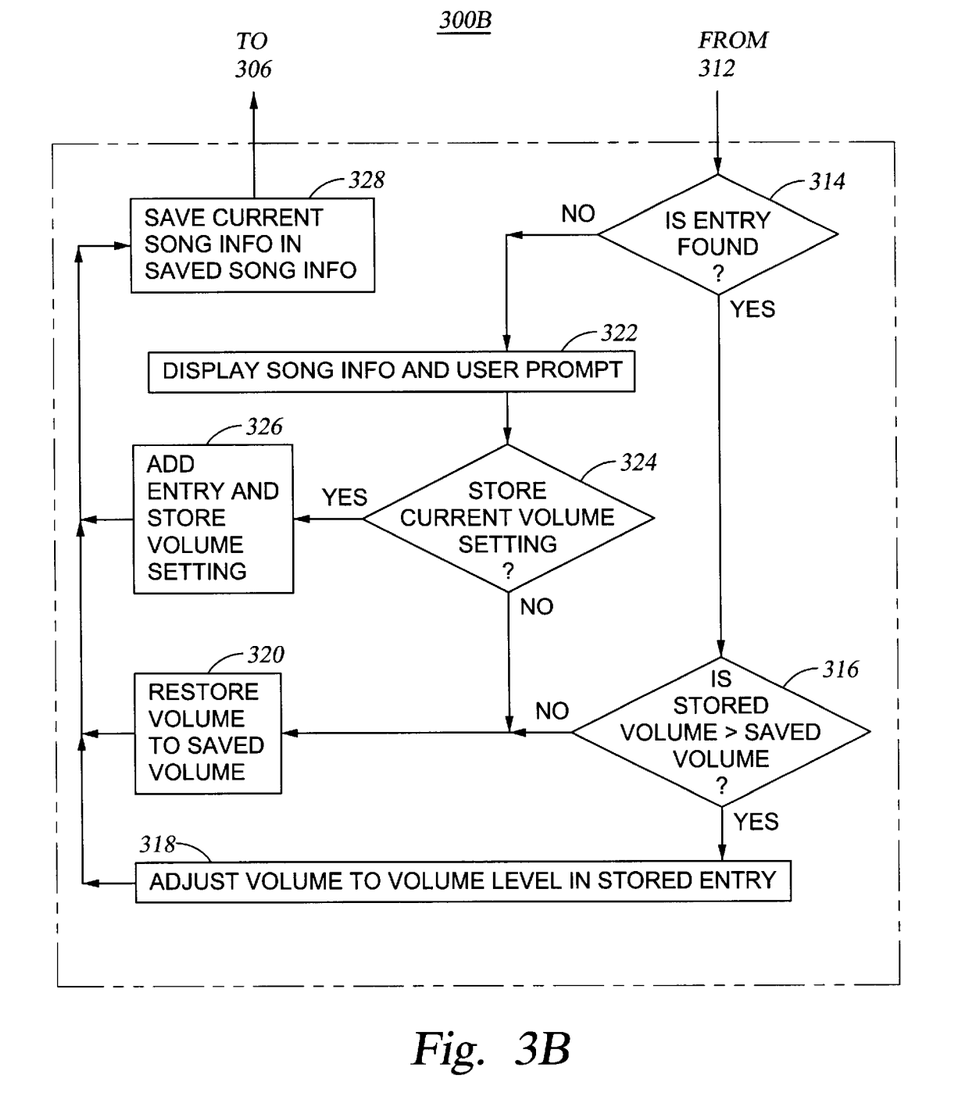
FIG. 3b is a flow diagram illustrating an alternative embodiment of the automatic volume adjustment process 300b having an option for a listener to store volume settings for a currently playing song.

FIG. 3b illustrates an alternative embodiment of the automatic volume adjustment process 300b having an option for a listener to store volume settings for a currently playing song. This alternative embodiment of the automatic adjustment process 300 includes an option for the listener to store sound reproduction settings, such as volume, for songs or audio programs that have no entry in memory of the stored sound reproduction setting associated with the song or audio program. The process 300b includes the same steps 302–312 as described above in FIG. 3A. Steps 314, 316, 318, 320 and 328, as described above, are also repeated in the process 300b. The user option for storing volume settings is triggered when no entry for the current song is found in memory 104. If no entry is found by step 314 in memory 104, then the current song information is displayed to the user (step 322), and a user prompt is also displayed (e.g., on display 106) to the user to store current sound reproduction settings into memory 104 for the current song or audio program being processed. The process 300b then determines whether the listener wants to create a song entry and store current volume settings in step 324. If the listener does not want to store the volume setting for the current song, the process 300b proceeds to step 320. In step 324, a default setting "no" may be triggered after a short time (e.g., 5 seconds) has lapsed without response from the user. If the listener inputs a signal, such as by manipulating controls 108, to store the current volume setting for the current program or song, the process 300b proceeds to step 326, and the current volume setting and the current song information is stored as an entry in memory 104. Alternatively, step 326 provides a user option to adjust the current volume setting and store the adjusted volume setting for the song. The process 300b then proceeds to step 328 and returns to step 306.

Figure 3C:
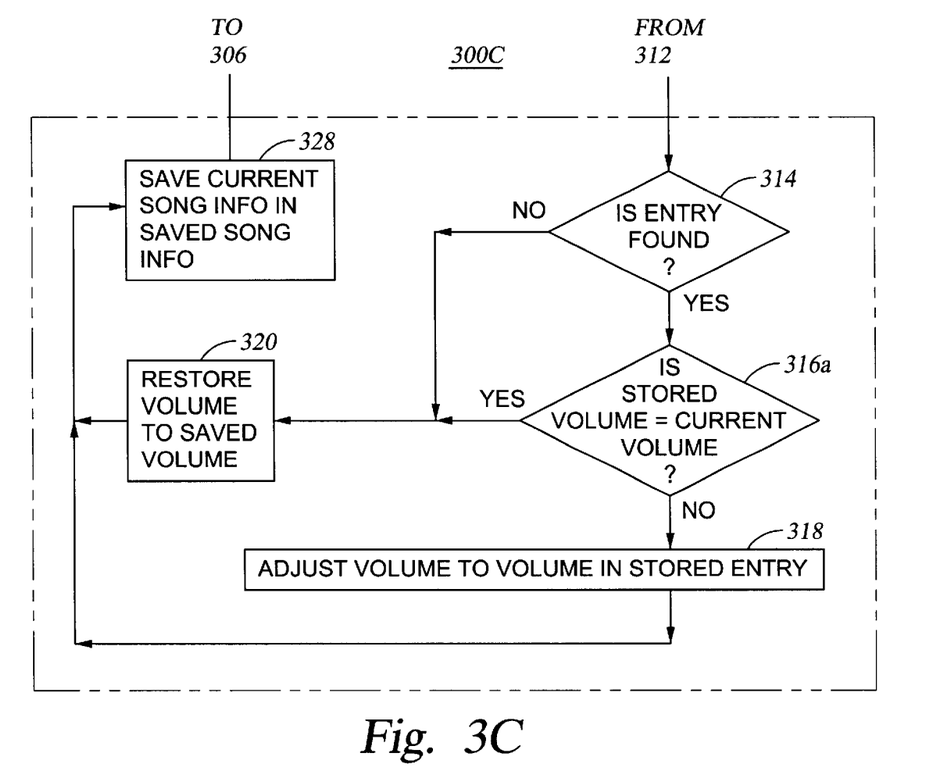
FIG. 3c is a flow diagram illustrating another alternative embodiment of the automatic volume adjustment process 300c which adjusts the volume setting to a stored volume setting for a currently playing song.

FIG. 3c illustrates another alternative of the automatic volume adjustment process 300c which adjusts the volume setting to a memorized volume setting for a currently playing song. This embodiment of the automatic volume adjustment process ensures that a song having a volume setting entry in memory 104 is always played at the stored volume setting. Thus, a listener always listens to his favorite songs (i.e., songs having entries in memory 104) at the stored volume level. The process 300c includes the same steps 302–312 as described above in FIG. 3A. At step 314, if an entry is found in memory 104 for the current song being played, a comparison step 316a is performed to determine whether the current volume setting is equal to the stored volume setting for the current song. If the current volume setting is equal to the stored volume setting, then the process 300c proceeds to step 320 and 328 and returns to step 306. If the current volume setting is not equal to the memorized volume setting for the current song, then the process 300c proceeds to step 318 in which the CPU 102 adjusts the volume setting to the memorized volume setting for the current song. The process 300c then proceeds to step 328, and returns to step 306. Referring back to step 314, if no entry is found, the process 300c proceeds to step 320 and 328, and returns to step 306. Alternatively, a user option to store an entry for the current song, as described in FIG. 3B, can be performed if no entry was found in step 314. As a further alternative, referring back to step 314, if an entry is found, the process 300c skips step 316a and proceeds to step 318 to adjust current volume level to match the stored entry, and if no entry is found in step 314, the process 300c proceeds to step 320.

Figure 4:
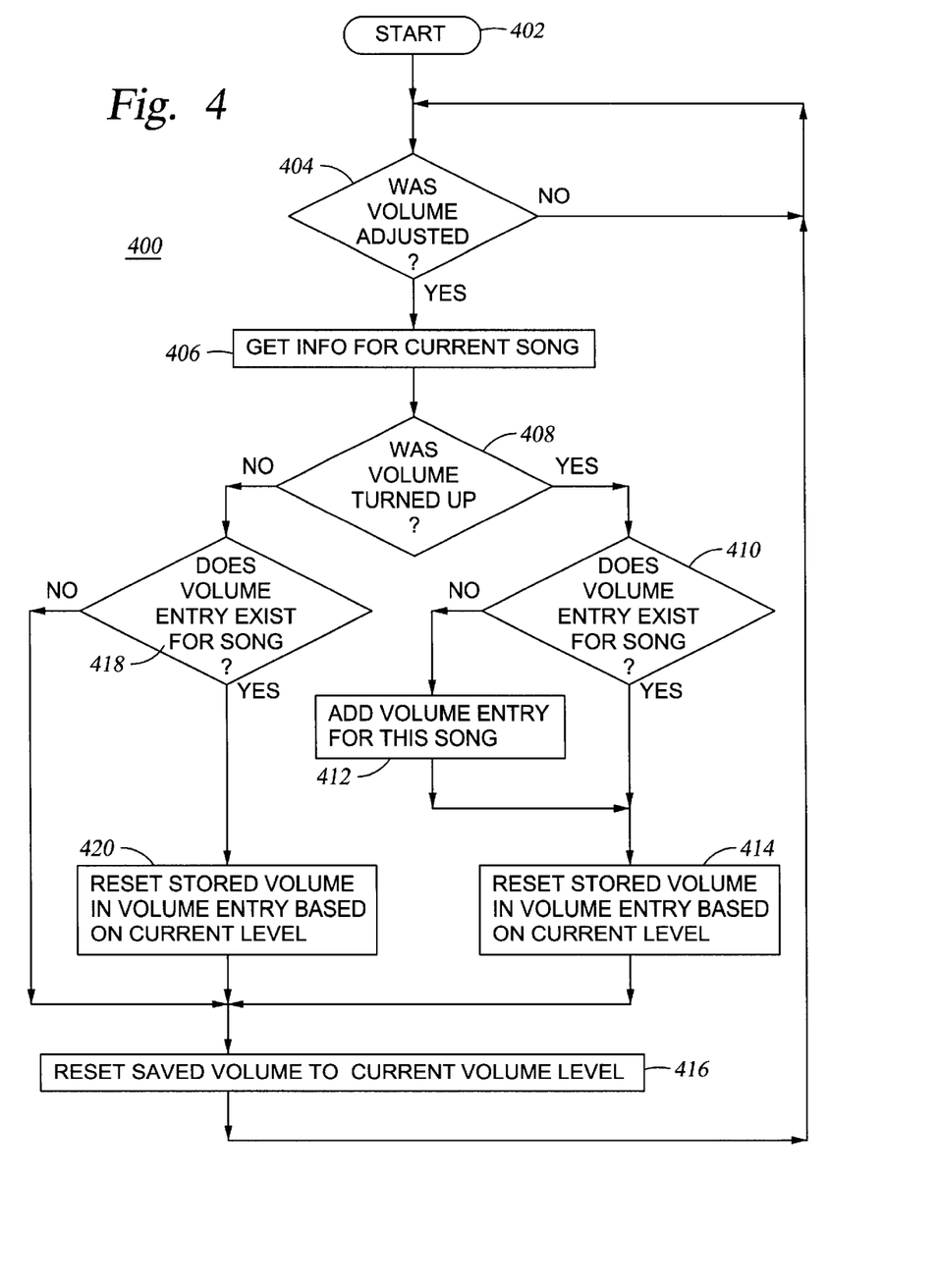
FIG. 4 is a flow diagram illustrating a volume change detection process 400 of the invention.

The invention contemplates a number of ways for generating stored entries 200 in memory 104. For example, a user option/prompt to create a song entry can be provided for each song that is not found in memory 104. Entries in memory 104 can also be generated utilizing a volume change detection process 400 as described below. The volume change detection process 400 is also utilized to alter stored volume settings in stored entries in memory 104.

FIG. 4 illustrates a volume change detection process 400 of the invention. Illustratively, the process 400 describes a volume change detection process for a song. However, the process 400 is applicable to any signal type. The process 400 is typically run concurrently in the background with the automatic volume adjustment process 300. The process 400 may be performed utilizing the CPU 102 of the audio system and begins at step 402 which corresponds to activation of the audio system, such as turning-on a car stereo receiver. At step 404, the process 400 detects whether the volume setting has been adjusted. Step 404 is repeated until the volume setting is changed by the listener, and once a volume change is detected, the current song information is retrieved by the CPU 102 from the digital packets with the song (step 406). Next, the CPU 102 determines whether the volume setting was increased in step 408. If the volume was increased, the process 400 proceeds to step 410 to search the memory 104 to determine whether a stored volume entry is stored in memory for the current song. If no stored volume entry is found in memory 104, an entry is created corresponding to the current song (step 412). A volume setting is then stored into the entry (step 414) corresponding to the current song based on current volume level. If a stored volume entry is found for the current song, then the process 400 proceeds to step 414, and the stored volume in the volume entry is changed based on current volume level. The process 400 then proceeds to step 416, and the saved volume is reset to the current volume level. Step 416 can be made an optional step to allow a listener to maintain his initial volume setting for use in processes 300a–c. The process 400 then proceeds back to step 404 to detect another volume adjustment.

The invention contemplates a variety of schemes for storing volume in volume entry based on current level in step 414. For example, a scheme for storing volume may include a default mode which stores a volume level, such as half way, between the current playing level and the stored level in the volume entry. As another example, the current volume level can be stored as the volume level entry. Alternatively, a number of user options can be provided for user control of storing volume levels in the volume entry.

Referring back to step 408, if the volume level was turned down, the process 400 proceeds to step 418 to determine whether a volume entry exists for the song. If no volume entry exists for the song, the process 400 proceeds to optional step 416, and the saved volume is reset to the current volume. If a volume entry exists for the song, the process 400 proceeds to step 420, and the stored volume in the volume entry is reset based on current volume level. During step 420, a listener or user can be given one or more options to reset the stored volume in the volume entry. For example, the stored volume in the volume entry can be reset as the current level. Alternatively, the stored volume could be reset as a volume level between the current level and the stored volume level, such as a half-way level. After resetting the stored volume in the volume entry in step 420, the process proceeds to optional step 416, and then returns to step 404.

Figure 5:
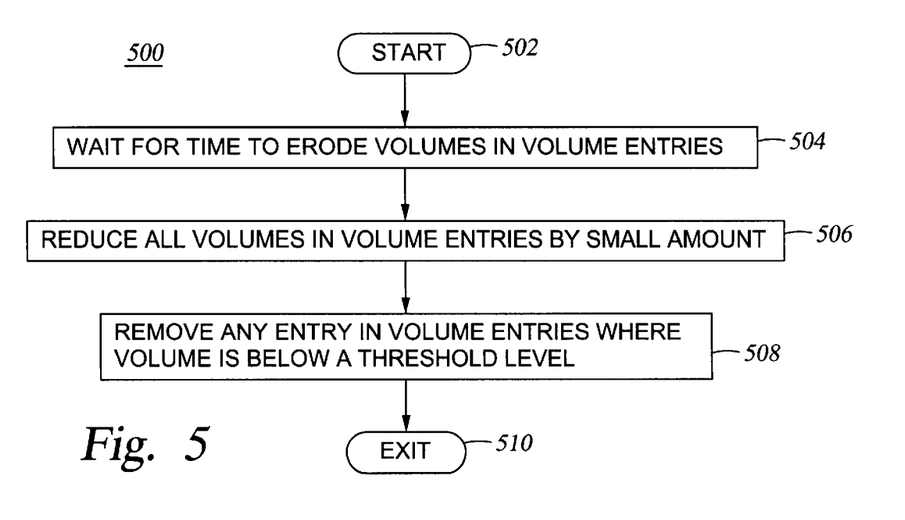
FIG. 5 is a flow diagram illustrating a volume erosion process 500 of the invention.

FIG. 5 is a flow chart illustrating a volume erosion process 500. The volume erosion process 500 provides a method of removing volume entries that have become insignificant over time. For example, a listener may grow tired of listening to a song and prefer not to listen at a loud volume when the song is played again. The volume erosion process 500 decreases the volumes stored in entries and removes those entries that have been decreased below a threshold volume level over time. Preferably, the threshold level is set by the listener at a level substantially lower than the listener's normal listening volume level. For example, the CPU 102 may continually track an average volume level being played on the system and set the threshold level at about –12dB from the average volume level. Preferably, the process 500 is an optional process which is selectively activated by a user. As a further alternative embodiment, the invention may provide a user option to delete entries directly from memory 104.

The process 500 starts with step 502 and runs in the background while the audio system or car receiver is activated. After starting, the process 500 waits for a preset period of time at step 504. A timer or counter can be used by the CPU 102 to determine this preset amount of time, or the CPU 102 could determine the time or preset time period using a time stamp and measuring a difference between current time and the time stamp. After a preset amount of time, the process 500 proceeds to step 506 and, all volume levels in volume entries are reduced by a predetermined amount. For example, all volume entries can be reduced by about 0.5 decibels. The process 500 then proceeds to step 508 to remove all entries in the volume entries that have volume levels below a threshold level. Step 508 may also provide a user prompt and/or user option to confirm deletion of an entry from memory. Thus, if a user had stored a volume entry that is below the threshold level, the user may override the entry deletion and retain the entry. The process 500 then ends at step 510. Alternatively, after step 508, the process 500 returns to step 504 and repeat the volume erosion process.

The stored entries 200 in memory 104 may also include a field to indicate whether an entry is to be excluded in the volume erosion process 500. Thus, a listener may retain certain entries in memory 104 (e.g., all time favorite list of songs) that are not affected by the volume erosion process 500.

While the foregoing is directed to the preferred embodiment of the present invention, other and further embodiments of the invention may be devised without departing from the basic scope thereof, and the scope thereof is determined by the claims that follow.

What is claimed is:

1. A method for adjusting an output parameter for an audio system, comprising:
   determining whether a stored output parameter setting is associated with an audio program being processed on the audio system;
   if the stored output parameter setting is associated with the audio program, comparing the stored output parameter setting to a saved output parameter setting;
   if the stored output parameter setting is different than the saved output parameter setting, changing the output parameter to the stored output parameter setting;
   periodically decreasing a value of the stored output parameter setting; and if the value of the stored output parameter setting is less than a threshold value, deleting the stored output parameter setting from memory.

2. The method of claim 1, further comprising:
providing a user option to store into memory a current output parameter setting as a stored output parameter setting associated with the audio program.

3. The method of claim 1, wherein the stored output parameter setting includes at least one parameter selected from the group consisting of volume, bass, treble and combinations thereof.

4. The method of claim 1, wherein the saved output parameter setting is a current output parameter setting.

5. The method of claim 1, wherein the saved output parameter setting is an initial output parameter setting.

6. The method of claim 1, wherein the audio system receives the audio program from a broadcast signal.

7. The method of claim 1, wherein the audio system processes audio programs stored on a data storage medium.

8. The method of claim 1, further comprising:
providing a user prompt to confirm deletion of the stored output parameter from memory.

9. The method of claim 1, further comprising:
designating one or more stored output parameter settings which are excluded from the value decreasing step.

10. The method of claim 1, further comprising:
detecting an adjustment to the output parameter; and
changing the stored output parameter setting based on the adjustment.

11. The method of claims 10, wherein the stored output parameter setting is changed to a value between the stored output parameter setting and an adjusted output parameter setting.

12. The method of claim 10, further comprising:
if no stored output parameter setting is associated with the audio program, storing in memory a current output parameter as the stored output parameter setting associated with the audio program.

13. The method of claim 1, further comprising:
receiving identification data of the audio program.

14. The method of claim 13, wherein the identification data comprises digital data.

15. The method of claim 13, wherein the identification data comprises analog data.

16. A method for adjusting an output parameter for an audio system, comprising:
determining whether a stored output parameter setting is associated with an audio program being processed on the audio system, wherein the stored output parameter setting includes a stored volume setting;
if the stored output parameter setting is associated with the audio program, comparing the stored output parameter setting to a saved output parameter setting;
if the stored output parameter setting is greater than the saved output parameter setting, changing the output parameter to the stored output parameter setting; and
periodically performing a volume erosion process, the process comprising:
decreasing the stored volume setting by a fixed decrement;
comparing the stored volume setting to a threshold volume setting; and
if the stored volume setting is less than the threshold volume setting, deleting from memory the stored output parameter setting for the audio program.

17. A computer-readable medium containing instructions which, when executed by one or more processes, performs a method comprising:
determining whether a stored output parameter setting is associated with an audio program being processed on the audio system, wherein the stored output parameter setting includes a stored volume setting;
if the stored output parameter setting is associated with the audio program, comparing the stored output parameter setting to a saved output parameter setting;
if the stored output parameter setting is greater than the saved output parameter setting, changing the output parameter to the stored output parameter setting; and
periodically performing a volume erosion process, the process comprising:
decreasing the stored volume setting by a fixed decrement;
comparing the stored volume setting to a threshold volume setting; and
if the stored volume setting is less than the threshold volume setting, deleting from memory the stored output parameter setting for the audio program.

18. A computer-readable medium containing instructions which, when executed by one or more processes, performs a method comprising:
determining whether a stored output parameter setting is associated with an audio program being processed on the audio system;
if the stored output parameter setting is associated with the audio program, comparing the stored output parameter setting to a saved output parameter setting;
if the stored output parameter setting is different than the saved output parameter setting, changing the output parameter to the stored output parameter setting;
periodically decreasing a value of the stored output parameter setting; and
if the value of the stored output parameter setting is less than a threshold value, deleting the stored output parameter setting from memory.

19. The computer-readable medium of claim 18, wherein the method further comprises:
providing a user option to store into memory a current output parameter setting as a stored output parameter setting associated with the audio program.

20. The computer-readable medium of claim 18, wherein the method further comprises:
providing a user prompt to confirm deletion of the stored output parameter from memory.

21. The computer-readable medium of claim 18, wherein the method further comprises:
designating one or more stored output parameter settings which are excluded from the value-decreasing step.

22. The computer-readable medium of claim 18, wherein the method further comprises:
detecting an adjustment to the output parameter; and
changing the stored output parameter setting based on the adjustment.

23. The computer-readable medium of claim 22, wherein the method further comprises:
if no stored output parameter setting is associated with the audio program, storing in memory a current output parameter as the stored output parameter setting associated with the audio program.

24. An apparatus for adjusting an output parameter of an audio system, comprising:
  a memory for storing a stored output parameter setting associated with an audio program being played on the audio system; and
  a processor configured to:
    determine whether a stored output parameter setting is associated with an audio program being processed on the audio system;
    if the stored output parameter setting is associated with the audio program, compare the stored output parameter setting to a saved output parameter setting;
    if the stored output parameter setting is different than the saved output parameter setting, change the output parameter to the stored output parameter setting,
    periodically decrease a value of the stored output parameter setting; and
    if the value of the stored output parameter setting is less than a threshold value, delete me stored output parameter setting from memory.

25. The apparatus of claim 24, wherein the processor is further configured to:
  provide a user option to store into memory a current output parameter setting as a stored output parameter setting associated with the audio program.

26. The apparatus of claim 24, further comprising:
  a display for displaying information from the processor.

27. The apparatus of claim 24, wherein the information displayed is selected from the group consisting of volume setting, bass setting, treble setting, audio program identification, and user prompt messages.

28. The apparatus of claim 24, wherein the processor is further configured to:
  providing a user prompt to confirm deletion of the stored output parameter from memory.

29. The apparatus of claim 24, wherein the processor is further configured to:
  designating one or more stored output parameter settings which are excluded from the value-decreasing step.

30. The apparatus of claim 24, wherein the processor is further configured to:
  detect an adjustment to the output parameter; and
  change the stored output parameter setting based on the adjustment.

31. The apparatus of claim 30, wherein the processor is further configured to:
  if no stored output parameter setting is associated with the audio program, store in memory a current output parameter as the stored output parameter setting associated with the audio program.

32. An apparatus for adjusting an output parameter of an audio system, comprising:
  a memory for storing a stored output parameter setting associated with an audio program being played on the audio system, wherein the stored output parameter setting includes a stored volume setting; and
  a processor configured to:
    determine whether a stored output parameter setting is associated with an audio program being processed on the audio system;
    if the stored output parameter setting is associated with the audio program, compare the stored output parameter setting to a saved output parameter setting;
  if the stored output parameter setting is greater than the saved output; parameter setting, change the output parameter to the stored output parameter setting; and
  periodically perform a volume erosion process, the process comprising:
  decreasing the stored volume setting by a fixed decrement;
  comparing the stored volume setting to a threshold volume setting; and
  if the stored volume setting is less than the threshold volume setting, deleting from memory the stored output parameter setting for the audio program.

* * * * *